United States Patent
Yamaguchi et al.

(10) Patent No.: US 11,380,523 B2
(45) Date of Patent: Jul. 5, 2022

(54) SEMICONDUCTOR MANUFACTURING APPARATUS

(71) Applicant: HITACHI HIGH-TECH CORPORATION, Tokyo (JP)

(72) Inventors: Yoshihide Yamaguchi, Tokyo (JP); Sumiko Fujisaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/645,960

(22) PCT Filed: Feb. 14, 2019

(86) PCT No.: PCT/JP2019/005262
§ 371 (c)(1),
(2) Date: Mar. 10, 2020

(87) PCT Pub. No.: WO2020/165990
PCT Pub. Date: Aug. 20, 2020

(65) Prior Publication Data
US 2021/0233747 A1 Jul. 29, 2021

(51) Int. Cl.
*H01J 37/32* (2006.01)
*C23F 1/12* (2006.01)

(52) U.S. Cl.
CPC ......... *H01J 37/32449* (2013.01); *C23F 1/12* (2013.01); *H01J 2237/3341* (2013.01)

(58) Field of Classification Search
CPC ..... C23C 14/24; C23C 14/243; C23C 14/246; C23C 14/26; C23C 14/28; C23C 14/30;
(Continued)

(56) References Cited

U.S. PATENT DOCUMENTS 4,097,278 A 6/1978 Bissonette
4,551,221 A * 11/1985 Axenov ............... H05H 1/50
118/723 VE
(Continued)

FOREIGN PATENT DOCUMENTS

JP H08157296 A 6/1996
JP 2000223481 A 8/2000
(Continued)

OTHER PUBLICATIONS

International Search Report dated Mar. 26, 2019 issued in PCT/JP2019/005262.
(Continued)

*Primary Examiner* — Rudy Zervigon
(74) *Attorney, Agent, or Firm* — Miles & Stockbridge, P.C.

(57) ABSTRACT

Provided is a semiconductor manufacturing apparatus that can etch a metal film containing a transition metal element at high speed and with high accuracy by using a complexing gas. The semiconductor manufacturing apparatus includes: a vacuum container 60; a processing chamber 1 that is provided in the vacuum container, and includes a stage 4 on which a sample 3 formed with a metal film containing a transition metal element is placed; and a vaporization chamber 2 that is provided in the vacuum container, and includes a vaporizing nozzle unit 70 configured to vaporize a complexing gas raw material liquid supplied from an outside. A complexing gas obtained by vaporizing the complexing gas raw material liquid is introduced into the processing chamber to etch the metal film of the sample.

7 Claims, 5 Drawing Sheets

(58) Field of Classification Search
CPC ........... C23C 14/32; H01J 37/32449; H01J 2237/3341; C23F 1/12
USPC ............... 118/723 VE; 156/345.33, 345.34, 156/345.11, 345.17
See application file for complete search history.

(56) References Cited

U.S. PATENT DOCUMENTS

| | | | | |
|---|---|---|---|---|
| 4,565,711 | A | * | 1/1986 | Pinkhasov .......... C23C 14/0021 118/727 |
| 5,019,531 | A | * | 5/1991 | Awaya .............. H01L 23/53238 257/E21.582 |
| 5,070,811 | A | * | 12/1991 | Feuerstein .............. C23C 14/32 118/727 |
| 5,462,014 | A | * | 10/1995 | Awaya ................ C23C 16/4557 118/725 |
| 6,099,649 | A | | 8/2000 | Schmitt et al. |
| 6,103,074 | A | * | 8/2000 | Khominich ......... H01J 37/3266 204/298.41 |
| 6,110,283 | A | * | 8/2000 | Yamamuka ......... C23C 16/4481 427/126.3 |
| 6,136,167 | A | * | 10/2000 | Misiano ............ H01J 37/32458 118/723 VE |
| 6,195,504 | B1 | * | 2/2001 | Horie ................... C23C 16/448 392/394 |
| 6,203,613 | B1 | | 3/2001 | Gates et al. |
| 6,271,498 | B1 | * | 8/2001 | Miyake ............... C23C 16/4481 118/723 VE |
| 6,273,951 | B1 | | 8/2001 | Vaartstra |
| 6,358,323 | B1 | * | 3/2002 | Schmitt ............. C23C 16/45565 118/726 |
| 6,596,085 | B1 | * | 7/2003 | Schmitt ............... B01F 23/2132 118/726 |
| 6,753,245 | B2 | | 6/2004 | Choi |
| 7,078,072 | B1 | * | 7/2006 | Hiraga ................... C23C 14/12 427/255.6 |
| 7,201,942 | B2 | * | 4/2007 | Jurgensen ........... C23C 16/4481 118/724 |
| 7,422,198 | B2 | * | 9/2008 | Yoshioka .............. F16K 11/207 261/78.2 |
| 7,731,162 | B2 | * | 6/2010 | Yoshioka ............ F16K 31/1221 261/49 |
| 8,415,237 | B2 | * | 4/2013 | Horii ................. H01L 21/31691 118/723 VE |
| 10,325,781 | B2 | | 6/2019 | Shinoda et al. |
| 2003/0211748 | A1 | | 11/2003 | Jin et al. |
| 2004/0011380 | A1 | | 1/2004 | Ji et al. |
| 2004/0110375 | A1 | | 6/2004 | Chen et al. |
| 2004/0129674 | A1 | | 7/2004 | Bease et al. |
| 2005/0072361 | A1 | * | 4/2005 | Yang .................... C23C 14/246 427/248.1 |
| 2006/0126700 | A1 | * | 6/2006 | Wilcox .................... H05B 6/26 373/151 |
| 2006/0165892 | A1 | | 7/2006 | Weidman |
| 2007/0072403 | A1 | | 3/2007 | Sakata |
| 2007/0190362 | A1 | | 8/2007 | Weidman |
| 2008/0265380 | A1 | | 10/2008 | Ragnarsson et al. |
| 2009/0258502 | A1 | | 10/2009 | Bae et al. |
| 2009/0293808 | A1 | * | 12/2009 | Yamazaki ............. C23C 14/564 427/255.6 |
| 2010/0041236 | A1 | | 2/2010 | Lin et al. |
| 2010/0099264 | A1 | | 4/2010 | Elers |
| 2010/0109321 | A1 | | 5/2010 | Sawamura et al. |
| 2011/0140762 | A1 | * | 6/2011 | Jiang ................... G11C 13/003 327/365 |
| 2011/0183527 | A1 | | 7/2011 | Cho et al. |
| 2011/0207323 | A1 | | 8/2011 | Ditizio |
| 2011/0212629 | A1 | | 9/2011 | Ivanov et al. |
| 2012/0077322 | A1 | | 3/2012 | Hirota et al. |
| 2013/0052346 | A1 | | 2/2013 | Higashi et al. |
| 2013/0203267 | A1 | | 8/2013 | Pomarede et al. |
| 2014/0227881 | A1 | * | 8/2014 | Lubomirsky ........... C23C 16/54 156/345.35 |
| 2015/0279697 | A1 | | 10/2015 | Matsuda et al. |
| 2015/0299848 | A1 | | 10/2015 | Haukka et al. |
| 2016/0336175 | A1 | | 11/2016 | Hirose et al. |
| 2017/0032990 | A1 | | 2/2017 | Lin et al. |
| 2017/0062205 | A1 | | 3/2017 | Chang et al. |
| 2017/0125261 | A1 | | 5/2017 | Miyama et al. |
| 2018/0076051 | A1 | | 3/2018 | Shinoda et al. |
| 2018/0122647 | A1 | * | 5/2018 | Kuratomi ................. H01J 37/00 |
| 2018/0166255 | A1 | | 6/2018 | Blomberg et al. |
| 2018/0290168 | A1 | * | 10/2018 | Han ................... C23C 16/45512 |
| 2018/0308707 | A1 | | 10/2018 | Yamaguchi |
| 2019/0103279 | A1 | * | 4/2019 | Yang .................... H01L 21/3105 |
| 2019/0103295 | A1 | * | 4/2019 | Hsu ..................... H01L 21/3065 |
| 2019/0131120 | A1 | | 5/2019 | Yamaguchi |
| 2019/0189401 | A1 | * | 6/2019 | Singh ................. H01J 37/32449 |
| 2019/0348307 | A1 | | 11/2019 | Yamauchi et al. |
| 2020/0033820 | A1 | * | 1/2020 | Furuya ............... G05B 13/0265 |
| 2020/0033838 | A1 | * | 1/2020 | Fujita ................. G05B 13/0265 |
| 2020/0051828 | A1 | | 2/2020 | Yamaguchi |
| 2021/0233747 | A1 | * | 7/2021 | Yamaguchi ....... H01J 37/32449 |

FOREIGN PATENT DOCUMENTS

| | | |
|---|---|---|
| JP | 2001332540 A | 11/2001 |
| JP | 2009252895 A | 10/2009 |
| JP | 2015191922 A | 11/2015 |
| JP | 201728198 A | 2/2017 |
| JP | 201784965 A | 5/2017 |
| JP | 2018110229 A | 7/2018 |
| JP | 2018110230 A | 7/2018 |
| JP | 2018186149 A | 11/2018 |

OTHER PUBLICATIONS

Steven George et al., "Thermal Atomic Layer Etching Using Sequential, Self-Limiting Fluorination and Ligand-Exchange Reactions", Proceeding of 38th International Symposium on Dry Process, Nov. 21-22, 2016, pp. 15-16.

* cited by examiner

[FIG. 1]
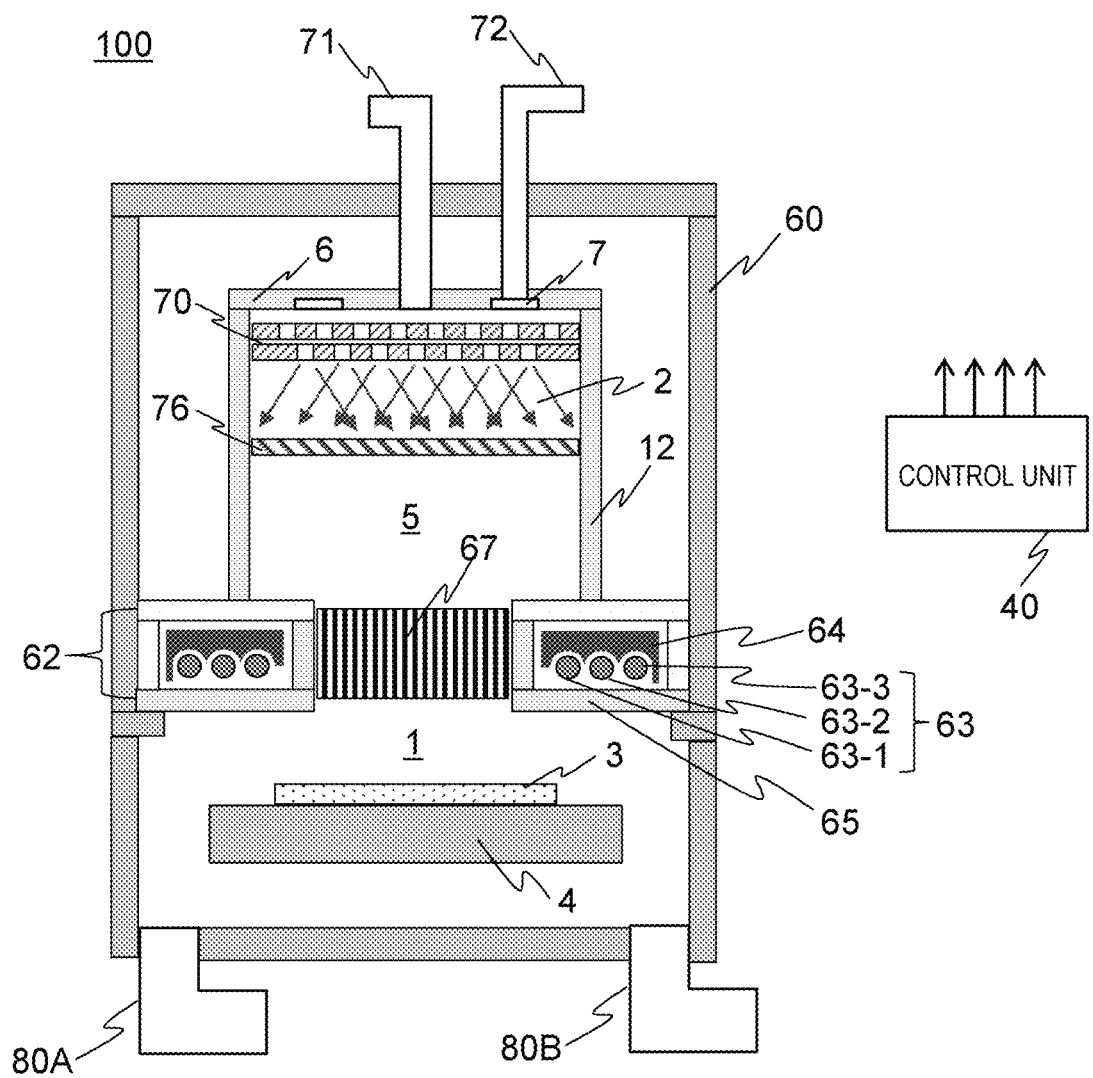

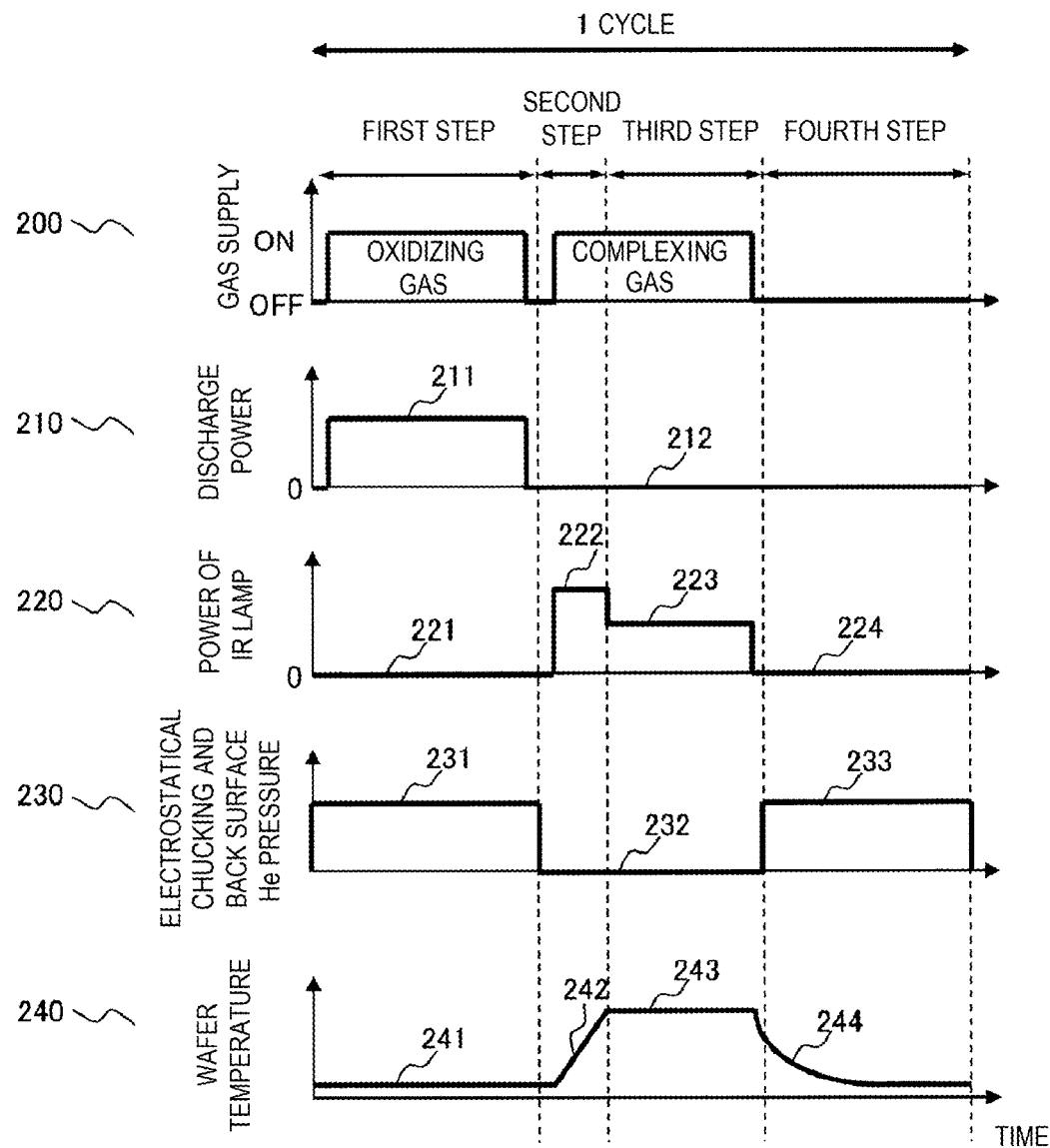

[FIG. 3]
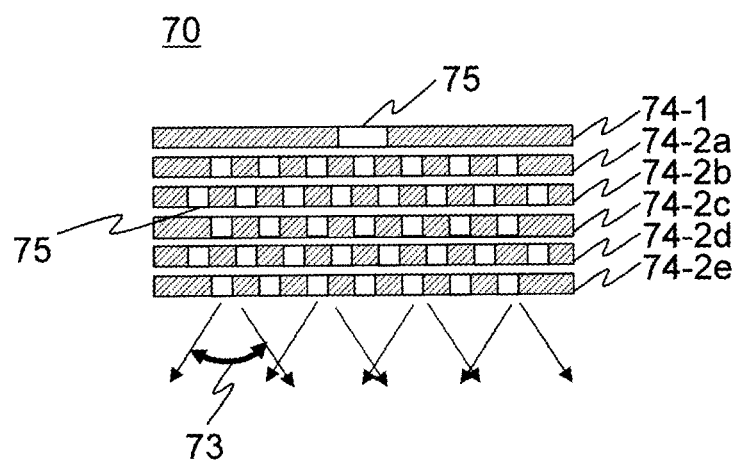
[FIG. 4A]
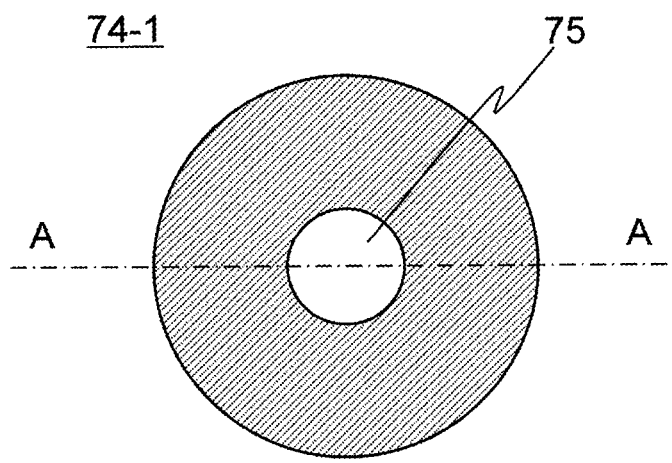

[FIG. 4B]
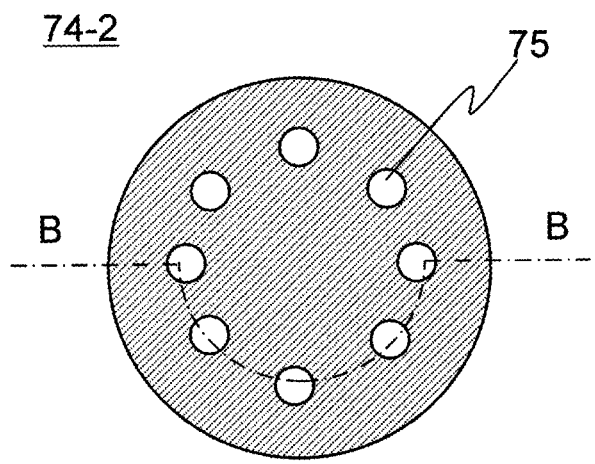
[FIG. 5]
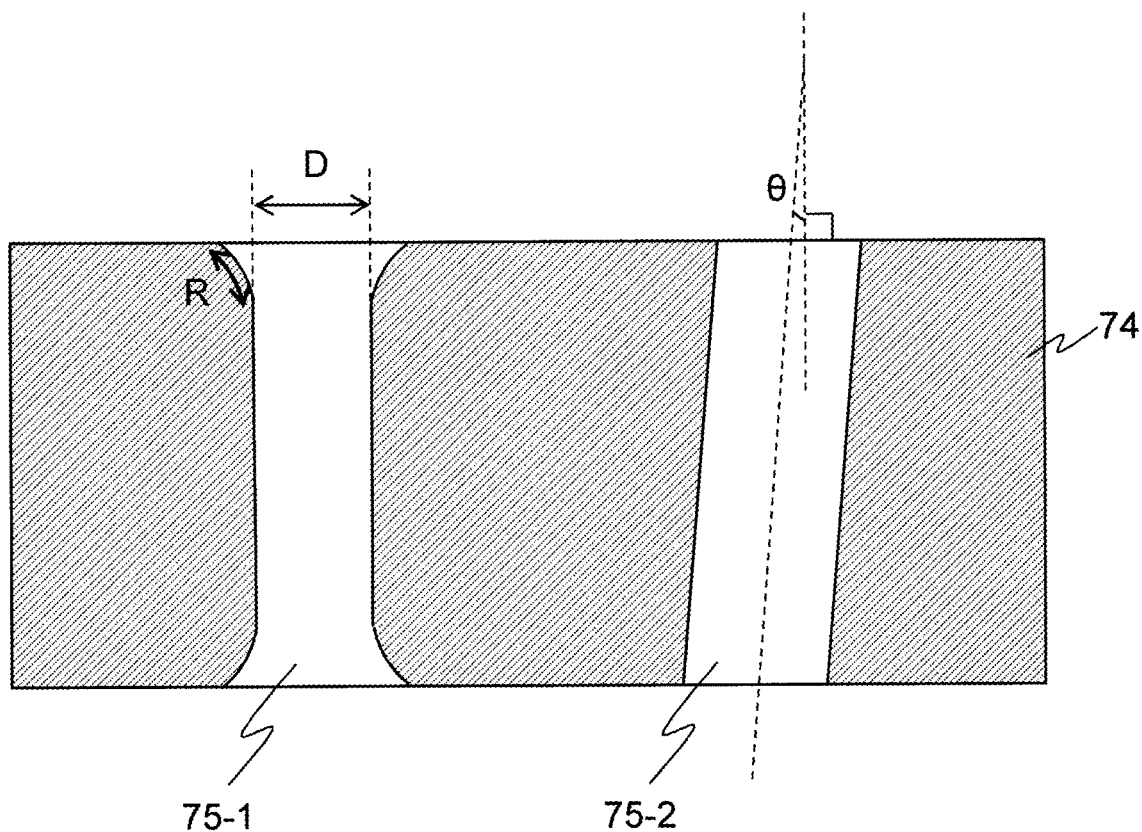

[FIG. 6]
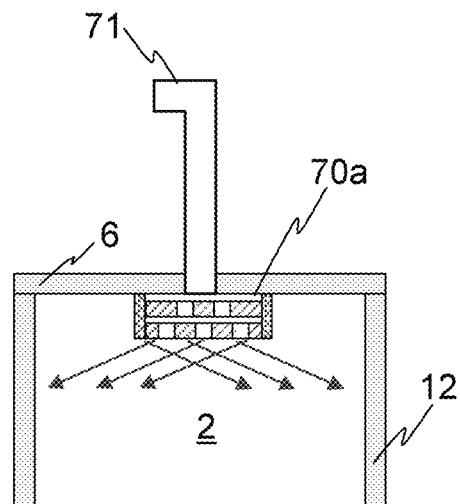
[FIG. 7]
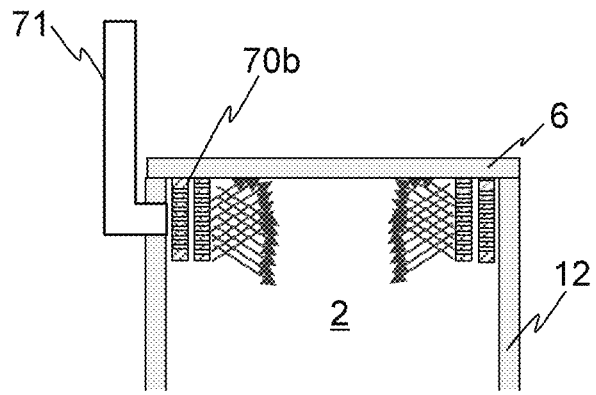

SEMICONDUCTOR MANUFACTURING APPARATUS

TECHNICAL FIELD

The present invention relates to a semiconductor manufacturing apparatus configured to etch a metal film containing a transition metal element using a complexing gas.

BACKGROUND ART

There is a constant demand for miniaturization, high speed and high performance, and power saving for the most advanced semiconductor device, so that a wide variety of new materials are adopted, and a variation in processing accuracy is required to be minimized. For example, application of a metal film containing a transition metal element such as cobalt (Co) or ruthenium (Ru) having high electromigration resistance has been studied as a wiring material, instead of aluminum (Al) or copper (Cu), and it is required to process the new materials with high accuracy of a nanometer level.

PTLs 1 to 3 disclose a method of etching a metal film containing a transition metal element using a $\beta$-diketone-containing gas. PTL 1 discloses that an etching rate is stabilized by limiting a moisture content contained in the etching gas to 30 ppm by mass or less in the etching of the transition metal film using the $\beta$-diketone. PTL 2 discloses that generation of a carbon-based contamination is inhibited and an etching rate is increased by using an etching gas obtained by adding an oxidizing gas (first additive gas) such as NO and $H_2O$ or $H_2O_2$ (second additive gas) in the $\beta$-diketone, and setting an amount of the $\beta$-diketone contained in the etching gas to 10% by volume or more and 90% by volume or less, and an amount of the second additive gas contained in the etching gas to 0.1% by volume or more and 15% by volume less. PTL 3 discloses that generation of a carbon-based contamination is inhibited by supplying an oxidizing gas, and then supplying a $\beta$-diketone-containing etching gas to which a component (a reducing gas) for inhibiting decomposition of the $\beta$-diketone is added.

CITATION LIST

Patent Literature

PTL 1: JP-A-2018-110230
PTL 2: JP-A-2018-110229
PTL 3: JP-A-2017-28198

SUMMARY OF INVENTION

Technical Problem

In PTL 1 which aims at stabilizing the etching rate and PTL 2 which aims at increasing the etching rate, it can be said that it is difficult to achieve both a stable etching rate and an increased etching rate because mutually contradictory characteristics in terms of moisture content exist in conclusion. On the other hand, in PTLs 2 and 3, an oxidizing gas is added on one hand while a reducing gas is added on the other hand for the problem of inhibiting the generation of the carbon-based contamination.

Actions and effects of the added gas of the etching gas containing the $\beta$-diketone as a main component is not sufficient understood when the disclosures of such patent literatures are combined, and it is necessary to further study reliability of a processing process suitable for mass production of a semiconductor device.

The inventors of the invention have studied a chemical reaction that occurs during an entire process of etching a metal film containing a transition metal element in detail, and has found that some decomposition processes are inhibited by adding an oxidizing gas, while other decomposition processes are inhibited by adding a reducing gas, and the generation of a carbon-based contamination cannot be avoided by adding only one of the oxidizing gas and the reducing gas. In particular, since the $\beta$-diketone is a liquid at room temperature, the raw $\beta$-diketone liquid needs to be vaporized by heating and supplied as a gas to the metal film containing a transition metal element to be processed which is placed in a vacuum atmosphere. However, there is a concern that a part of the $\beta$-diketone-containing gas vaporized in a raw material liquid tank may be decomposed in the course of supplying it.

Solution to Problem

A semiconductor manufacturing apparatus according to an aspect of the invention includes: a vacuum container; a processing chamber disposed in a lower portion of the vacuum container, and which includes a stage disposed in a central region of the lower portion of the processing chamber and on which a sample with a metal film containing a transition metal element is placed; a vaporization chamber disposed in an upper portion of the vacuum container and which is configured to vaporize fine droplets of a complexing gas raw material liquid supplied from a vaporizing nozzle unit; and a path which communicates between the processing chamber and the vaporization chamber above the stage and through which the complexing gas obtained by vaporizing the complexing gas raw material liquid is introduced into the processing chamber and onto a surface of the metal film of the sample; and a lamp heater unit disposed above the processing chamber and around the path, the lamp heater unit including at least one circular-shaped lamp heater and a transmission window disposed under the at least one of circular-shaped lamp heater through which electromagnetic waves are emitted downward from the at least one circular-shaped lamp heater toward the sample placed on the stage after the complexing gas is introduced onto the metal film of the sample to heat the sample to a predetermined temperature to etch the metal film.

Advantageous Effect

A semiconductor manufacturing apparatus is provided, which can etch a metal film containing a transition metal element at high speed and with high accuracy by using a complexing gas.

Other problems and novel characteristics will become apparent from a description of the description and the accompanying drawings.

BRIEF DESCRIPTION OF DRAWINGS

FIG. 1 is a schematic view of main parts of a semiconductor manufacturing apparatus.

FIG. 2 is a time chart of an etching step (one cycle).

FIG. 3 is a cross-sectional view (schematic view) of a vaporizing nozzle unit.

FIG. 4A is an example of a planar shape of a perforated heat exchanging plate.

FIG. 4B is an example of the planar shape of the perforated heat exchanging plate.

FIG. 5 is a view showing a cross-sectional shape of a hole provided in the perforated heat exchanging plate.

FIG. 6 is another structure example of the vaporizing nozzle unit.

FIG. 7 is still another structure example of the vaporizing nozzle unit.

DESCRIPTION OF EMBODIMENTS

FIG. 1 is a vertical sectional view schematically showing a configuration of a semiconductor manufacturing apparatus 100. The semiconductor manufacturing apparatus 100 includes a vacuum container 60, and a stage 4 is provided inside a processing chamber 1 disposed in a lower portion of the vacuum container 60. A wafer 3 as a sample to be processed is placed on the stage 4. The wafer 3 is carried into and out from an inside of the processing chamber 1 through a wafer transfer port (not shown) provided in the processing chamber 1. A quartz chamber 12 that functions as a vaporization chamber or a plasma source is provided in an upper portion of the vacuum container 60. An inductively coupled plasma (ICP) coil (not shown) is installed outside the quartz chamber 12 in order to generate ICP plasma when, for example, an ICP discharge method is used as the plasma source.

A top plate 6 is provided at an upper portion of the quartz chamber 12. In the semiconductor manufacturing apparatus of the present embodiment, as will be described later, a complexing gas is introduced into the vacuum container 60 in a form of a raw material liquid and then the liquid is vaporized. The raw material liquid is introduced from a raw material supply pipe 71 passing through the top plate 6, and is vaporized in a vaporization chamber 2 provided in the upper portion of the quartz chamber 12. A shower plate 7 is provided on the top plate 6, and as a gas, a mixed etching gas (processing gas) to be introduced into the vacuum container 60 is introduced into the processing chamber 1 from a processing gas pipe 72 through the shower plate 7. The mixed etching gas is supplied in a state where a supply amount is adjusted by a mass flow controller for each gas type included in a gas supply unit (not shown). A gas dispersion plate (not shown) may be disposed below the top plate 6. A discharge chamber 5 is provided between the processing chamber 1 and the vaporization chamber 2 to generate plasma inside the discharge chamber 5. When the plasma is generated in the discharge chamber 5, a high frequency power of several tens of MHz is supplied to the ICP coil (not shown) while the mixed etching gas flows from the processing gas pipe 72 to the discharge chamber 5.

A slit plate 67 for performing path control is provided between the vaporization chamber 2 as well as the discharge chamber 5 and the processing chamber 1. The slit plate 67 functions as a rectifying plate for regulating a flow of the complexing gas, and has a function of controlling a concentration distribution of the complexing gas inside the processing chamber 1 when the complexing gas vaporized in the vaporization chamber 2 passes through the slit plate 67. At the time, the slit plate 67 also has a function of removing a particulate contamination suspending in the complexing gas vaporized in the vaporization chamber 2. On the other hand, the slit plate 67 functions as an ion shield plate for shielding ions and electrons when etching plasma formed by plasmatizing the etching mixed gas in the discharge chamber 5 passes through the slit plate 67. Accordingly, the wafer 3 is irradiated with neutral gases or radicals. Different slits may be used in a case where a complexing gas that is not plasmatized passes through the slit and in a case where etching plasma obtained by plasmatizing the mixed etching gas passes through the slit.

A vacuum exhaust pipe 80 for reducing a pressure inside the processing chamber 1 is connected to a lower portion of the vacuum container 60. Here, an example is shown, in which the vacuum exhaust pipe 80 is divided into two exhaust pipes 80A and 80B. The exhaust pipes may be merged before being connected to an exhaust unit such as a vacuum pump or a dry pump. An on-off valve (not shown) is provided in each of the vacuum exhaust pipe 80, the raw material supply pipe 71, and the processing gas pipe 72, and internal pressures of the vacuum container 60, the processing chamber 1, and the vaporization chamber 2 can be controlled by appropriately controlling an opening and closing balance of the on-off valves.

A vaporizing nozzle unit 70 is provided inside the vaporization chamber 2. The complexing gas raw material liquid is fed into the vaporizing nozzle unit 70 through the raw material supply pipe 71 in a state where the supply amount is adjusted by a liquid mass flow controller LMFC. A large number of fine flow paths made of a thermally conductive material such as a metal are provided inside the vaporizing nozzle unit 70, turbulent flows are generated while the complexing gas raw material liquid fed into the vaporizing nozzle unit 70 is branched into the flow paths, and fine droplets are formed. The complexing gas raw material liquid immediately after being emitted from the vaporizing nozzle unit 70 becomes extremely fine droplets, and the extremely fine droplets are rapidly vaporized inside the vaporization chamber 2 maintained in a depressurized condition. Although fine contaminations and impurities contained in the complexing gas raw material liquid are selectively removed during the process of passing through the fine flow paths inside the vaporizing nozzle unit 70, if necessary, a filter unit 76 may be installed between the discharge chamber 5 and the vaporization chamber 2 to remove the contamination which cannot be removed in the process of passing through the fine flow paths inside the vaporizing nozzle unit 70.

Heating lamp units 62 for achieving rapid heating of the wafer 3 are provided above the stage 4. Each heating lamp unit 62 includes an infrared (IR) lamp 63 for emitting infrared light and a reflection mirror (or reflection plate) 64 for controlling an emission direction of the IR light. A circle (circular-shaped) lamp is used as the IR lamp 63. In the example, the IR lamp 63 includes three IR lamps 63-1, 63-2, and 63-3 as one circle. However, the IR lamp 63 may include two or four IR lamps as one circle. An in-plane temperature distribution of the wafer 3 can be appropriately controlled by independently controlling the plurality of IR lamps 63. Further, in-plane temperature distribution control of the wafer 3 is further facilitated if the reflection plate 64 is a polygon mirror that can be independently controlled, and a slit for controlling a light flux amount is provided. An IR lamp power supply unit, a controller, a radiation thermometer for measuring a surface temperature of the wafer 3, and the like are provided in order to control the intensity and emission time of the IR light emitted from the IR lamp 63. Locations where the IR lamp power supply unit, the controller, and the radiation thermometer are provided are not limited to the inside of the heating lamp units 62, and the locations may be away from the vacuum container 60.

A refrigerant flow path or the like for cooling the stage 4 is provided inside the stage 4, and the temperature of the stage 4 is controlled using a controller, a chiller unit, or the like provided outside the processing chamber 1. An electrostatic chucking unit for chucking and fixing the wafer 3 is also provided inside the stage 4.

A control unit 40 controls each mechanism of the semiconductor manufacturing apparatus 100 as described above, and etching of a metal film containing a transition metal element and formed on the wafer 3.

FIG. 2 shows a time chart in one cycle in a case where a metal film containing a transition metal element such as Co or Ru having high electromigration resistance is etched by using oxygen as an oxidizing gas, and acetylacetone which is a typical substance of β-diketone as the complexing gas by the semiconductor manufacturing apparatus 100. Here, an example of etching a metal film containing Co is shown.

First, the wafer 3 on which a metal film containing Co to be etched is formed is carried into the processing chamber 1 via the transfer port provided in the processing chamber 1, and is mounted on the stage 4. In the wafer 3, a resist film or a hard mask film having an opening pattern is already formed at a desired position. The control unit 40 performs a series of controls of operating an electrostatic chucking DC power supply to electrostatically chuck and fix the wafer 3 to the stage 4, controlling a gas supply unit (not shown) to supply a He gas for wafer cooling between a back surface of the wafer 3 and the stage 4, setting a pressure 230 of the He gas between the back surface of the wafer 3 and the stage 4 to a predetermined pressure 231, and setting a temperature 240 of the wafer to a temperature 241. In the example, the wafer temperature 241 is set to 20° C., and the wafer temperature 241 may be set in a range of −20° C. to 100° C.

Subsequently, according to an instruction from the control unit 40, a flow rate of oxygen as the oxidizing gas to be supplied into the processing chamber 1 is adjusted by controlling the gas supply unit, and internal pressures of the processing chamber 1 and the quartz chamber 12 are set to target pressures by adjusting an amount of vacuum exhaust from the vacuum exhaust pipe 80. In this state, plasma discharge starts inside the quartz chamber 12 and plasma is generated inside the quartz chamber 12 by supplying a discharge power 211 to the ICP coil based on an instruction from the control unit 40. At this time, a power 220 applied to the IR lamp 63 is in a zero state (power 221) since the temperature of the wafer 3 is kept at 20° C. (wafer temperature 241).

In this state, a part of the oxygen gas is ionized and dissociated by the plasma. Neutral gas and radicals which are not ionized in a region where the plasma is generated pass through the slit plate 67 and are emitted onto the wafer 3. The radicals are adsorbed on the surface of the wafer 3 and reacts with the Co film to form a Co oxide layer. Due to an effect of the slit plate 67, ions generated in the plasma are hardly incident on the wafer 3. Therefore, the oxidation of the Co film mainly proceeds isotropically by the radicals.

After the plasma processing time required to form the Co oxide layer has elapsed, the controller 40 turns off the supply of the discharge power to the ICP coil (discharge power 212) to stop the plasma discharge. Further, the gas remaining in the processing chamber 1 is exhausted from the vacuum exhaust pipe 80. Then, the supply of the He gas to the back surface of the wafer is stopped, and the pressure on the back surface of the wafer 3 is set to the same level as the pressure in the processing chamber 1. By stopping the supply of the He gas on the back surface of the wafer, a wafer back surface He pressure 230 shown in FIG. 2 becomes a pressure 232. The above is a first step.

Before an oxidation processing in the first step, or after the oxidation processing, or before and after the oxidation processing, a plasma processing may be performed with a hydrogen gas to reduce a surface of an object to be processed, and an oxidation state of an oxide layer of the film containing Co may be adjusted.

Subsequently, supply of the acetylacetone, which is the complexing gas, to the processing chamber 1 is started. The control unit 40 controls the liquid mass flow controller to supply the acetylacetone gas in a liquid phase from the raw material supply pipe 71. The acetylacetone is turned into extremely fine droplets by the vaporizing nozzle unit 70, the droplets are vaporized in the vaporization chamber 2, and the obtained gas is supplied to the processing chamber 1 as a complexing gas.

The control unit 40 turns on an output of the IR lamp power supply unit to turn on the IR lamp 63 (electric power 222). The IR light emitted from the IR lamp 63 passes through an IR light transmission window 65 to heat the wafer 3. Accordingly, the wafer temperature rises as indicated as a temperature 242 (see the wafer temperature 240 shown in FIG. 2). During this heating and temperature raising process, the acetylacetone changes from physical adsorption to chemical adsorption onto the surface of the wafer 3. The wafer temperature 240 reaches 200° C., and a second step ends. In the example, the wafer temperature to be reached is set to 200° C. However, a wafer temperature 243 to be reached may be set in a range of 150° C. to 250° C. Although FIG. 2 shows an example in which the output of the IR lamp power supply unit is turned on at almost the same time when the complexing gas starts to be supplied to the processing chamber 1, the IR lamp 63 may be turned on after a certain period of time has elapsed since the start of the supply of the complexing gas. In this case, the wafer temperature is kept low during a period from the start of the supply of the complexing gas to the turn-on of the IR lamp 63.

The reason why it is desirable to start the supply of the complexing gas in a sufficiently low temperature of the wafer 3 is to take into consideration adsorption characteristics and reactivity of a main component of the complexing gas. In general, it is known that for a physical adsorption amount of a gaseous substance, when taking a boiling point of the substance as a boundary, physical adsorption is easy at a temperature side lower than the boiling point, and physical adsorption is difficult at a temperature side higher than the boiling point. The larger the physical adsorption amount is, the larger a reaction probability with a transition metal atom on the surface to be processed is. Therefore, the temperature of the wafer is preferably to be lower. In particular, as the main component of the complexing gas, for example, β-diketones such as acetylacetone and hexafluoroacetylacetone, the lower the temperature is, the higher the concentration of an enol-form molecular structure is. Therefore, the lower the temperature of the wafer 3 is, the higher the reactivity of the surface to be processed with respect to the transition metal atom, and the more rapidly a conversion from a physical adsorbent to a chemical adsorption complex proceeds.

Once the wafer temperature 240 reaches 200° C. (wafer temperature 243), the control unit 40 reduces the output of the IR lamp electric power supply to an electric power 223, thereby keeping the temperature of the wafer 3 constant at the temperature 243 for a certain period of time. In this manner, the acetylacetone is continuously supplied in a state where the temperature of the wafer 3 is maintained at 200° C. The Co oxide layer reacts with the acetylacetone adsorbed on the surface thereof, so that generation and sublimation removal of a reaction product mainly formed of cobalt acetylacetonate are repeated, and the thickness of the Co oxide layer is reduced. When the entire Co oxide layer 302 is removed, the etching is stopped. Although FIG. 2 shows a two-stage control example in which the output power 222 of the IR lamp power supply unit is initially kept at a predetermined constant value and the output power 223 of the IR lamp power supply unit is kept at a constant value lower than the output power 222 after reaching the wafer temperature 243, the output level may be controlled to be gradually changed in a plurality of stages depending on the type of film to be processed and the characteristics of the wafer.

The following elementary processes additionally proceed in order in the processing (etching) of the metal film containing the transition metal element on the surface to be processed. In an initial elementary process (the first elementary process), an oxidizing gas is supplied to a surface of the metal film containing the transition metal element, and the surface is under oxidation activation to change to a state of facilitating physical adsorption, which is a next elementary process (second elementary process). In the present embodiment, although oxygen plasma is used as an oxidizing agent to achieve isotropic oxidation, an oxidizing agent capable of achieving isotropic oxidation may be used. The second elementary process includes physical adsorption of a component of the complexing gas, for example, a β-diketone molecule, to the surface of the metal film in a specific oxidation state after physical adsorption activity of the complexing gas is increased in the first elementary process. In the surface of the metal film containing the transition metal element in a specific oxidation state, a β-diketone (enolate form) physically adsorbed to the surface is rapidly converted into a chemical adsorbent (third elementary process). After the end of the third elementary process, a reaction (fourth elementary process) in which the chemical adsorbent is converted into a volatile organic metal complex is started by a thermal stimulation to the wafer 3, and by inducing a sublimation removal (fifth elementary process) of the volatile organic metal complex using the heat of the above mentioned conversion reaction, the uppermost surface of the metal film containing the transition metal element is selectively and precisely etched and removed.

In the second step and the present step (third step), the wafer 3 is heated by the electromagnetic wave from the IR lamp 63, so that the surface of the wafer necessary for heating can be efficiently warmed, the heating can be rapidly completed even when there is a temperature difference of, for example, about 175° C. It is described that the wafer 3 is heated in a state of being placed on the stage 4. Alternatively, the wafer 3 may be lifted from the stage 4 by using a lift pin or the like, and irradiated with the IR light (electromagnetic wave) in a state of not in thermal contact with the stage 4. Accordingly, since heat transfer from the wafer 3 to the stage 4 can be inhibited, the temperature of the wafer 3 can be lifted to a desired temperature in a shorter time. The temperature of the wafer 3 is kept constant by controlling the IR lamp 63 based on the surface temperature of the wafer 3 measured by a radiation thermometer. A power ratio of the IR lamps 63-1, 63-2 and 63-3 may be controlled based on a radial temperature distribution in a plane of the wafer 3.

Thereafter, the control unit 40 turns off the output of the IR lamp electric power supply (electric power 224), and stops the heating of the wafer 3. Further, the gas remaining in the processing chamber 1 is exhausted quickly from the vacuum exhaust pipe 80. Thus, the third step ends. Although FIG. 2 shows a control example in which the supply stop of the complexing gas and the output OFF of the IR lamp power supply unit are almost the same, the complexing gas may be stopped prior to the output OFF of the IR lamp power supply unit. By causing the supply stop of the complexing gas to precede the output OFF of the IR lamp power supply unit, the evacuation of the volatile organic metal complex to the outside of the processing chamber 1 is promoted.

Subsequently, the control unit 40 controls the gas supply unit, to supply an Ar gas into the processing chamber 1 and supply the He gas between the back surface of the wafer 3 and the stage 4, so that the pressure 230 of the He gas between the back surface of the wafer 3 and the stage 4 is set to a predetermined pressure 233, and the cooling of the wafer 3 is started (temperature 244). The wafer temperature is cooled to 20° C. When the wafer 3 is lifted from the stage 4 by using a lift pin or the like and is irradiated with the IR light (electromagnetic wave) in a state of being not in thermal contact with the stage 4, a position of the lift pin is controlled to promote heat radiation to the stage 4 to realize rapid cooling. Thus, a fourth step ends.

The control unit 40 controls the etching of the metal film containing Co on the surface of the wafer 3 by repeatedly executing one cycle including the above-described first to fourth steps. Although not shown in FIG. 2, after the wafer 3 is fixed on the stage 4, it is desirable to heat the surface of the wafer 3 while maintaining the reduced pressure inside the vacuum container 60, and to desorb a gas (such as water vapor) or contamination adsorbed on the surface of the wafer 3. Since the heating treatment desorbs the gas or contamination adsorbed on the surface, it is also possible to apply a known method other than the heating under reduced pressure, for example, plasma cleaning. Further, these methods may be used in combination with the heat treatment, to shorten the time required for desorption of the gas or contamination by reducing the pressure as much as possible and performing the treatment in a high vacuum condition. After confirming that the desorption of the gas or the like adsorbed on the surface of the wafer 3 is completed based on a display of a pressure gauge provided in the vacuum container 60, the processing chamber 1, and the vaporization chamber 2, the heating of the wafer 3 is stopped while maintaining a reduced pressure condition, and the first step is started after cooling.

Next, description will be given about components of the complexing gas raw material liquid and a method of supplying the complexing gas raw material liquid for processing a metal film containing a transition metal element such as Co or Ru having high electromigration resistance.

A main component of the complexing gas raw material liquid is an organic compound capable of forming at least two or more coordination bonds with respect to a transition metal atom, that is, a so-calledpolydentate ligand. It is desirable that the main component of the complexing gas raw material liquid is an organic substance not coordinated with a metal atom, and the content (atomic %) of the metal atom is zero. Preferred examples of the complexing gas raw material liquid in the present embodiment include diketones, ketoesters, ketocarboxylic acids (including two C=O bonds), and ketoimines (including C=O bond and C=N bond). Preferred examples of specific substance names of diketones include acetylacetone, trifluoroacetylacetone, trifluorophenylbutandione, hexafluoroacetylacetone, dipivaloylmethane, thenoyltrifluoroacetone, trifluorofurylbutanedione, and dimethylheptafluorooctanedione. In addition to the above, for example, bidentate ligands such as hydroxymethylpyridine, phenanthroline, quinolinol, and β-hydroxy acid may be also applicable. Since the monodentate ligand such as formic acid or acetic acid is bonded to the transition metal atom by only one coordination bond, volatile organometallic complexes obtained from monodentate ligands and transition metal atoms have low thermal stability, and are not preferred because there is a risk of generating contaminations and residues during decomposition in the second and third steps of heating for sublimation removal.

An organic compound capable of forming at least two or more coordination bonds with respect to the transition metal atom reacts with a metal film containing a transition metal element such as Co or Ru on the wafer to forma thermally stable volatile organic metal complex molecule, and the complex molecule is removed by heating and vaporizing to achieve high accuracy processing.

In the present embodiment, the complexing gas raw material liquid is supplied in a liquid phase into the vacuum container 60 without being gasified in advance, and is vaporized inside the vacuum container 60 using the vaporizing nozzle unit 70 provided inside the vacuum container 60. The main component of the complexing gas raw material liquid, such as acetylacetone or hexafluoroacetylacetone, is liquid at room temperature. Therefore, the complexing gas raw material liquid is vaporized in advance outside the vacuum container 60. When the complexing gas raw material liquid is supplied in a gas phase, it is necessary to continue heating to maintain the entire pipe at a temperature higher than a boiling point (for example, 140° C. for acetylacetone and 70° C. for hexafluoroacetylacetone) of the component of the complexing gas raw material liquid so as not to cause dew condensation even in cold spots generated in the middle of the complexing gas pipe. Following problems may arise in the case of such a configuration.

(1) A pipe made of iron or iron-based metal is generally used as a pipe for supplying a processing gas to the semiconductor manufacturing apparatus. When the complexing gas raw material liquid is transported in a phase of a vaporized gas using the pipe made of iron or iron-based metal, an iron-based metal element (transition metal element) on an inner wall surface of the pipe at a high temperature reacts with the complexing gas. As a result, there is a concern that a part of the complexing gas may be leaked on the ground of reducing the thickness of the pipe, or a contamination derived from a pipe material may be mixed in.

(2) The β-diketone, which is a main component of the complexing gas raw material liquid, tends to convert a hydroxy derivative due to an additional reaction of a water molecule with a ketone group. There is a concern of dew condensation on the inner wall of the pipe causing blockage of the pipe since when water vapor remains in the pipe, a hydroxy derivative is generated, and the hydroxy derivative has lower volatility, higher boiling point and higher viscosity than the original β-diketone. As a result, a supply amount of the complexing gas decreases, and a speed of processing metal film is reduced.

When replacing a tank storing the complexing gas raw material liquid, the inner wall of the pipe connected to the tank is exposed to the atmosphere while it is in a short time. During this period, it is inevitable that the water vapor is adsorbed and occluded on the inner wall surface of the pipe. As a result, dew condensation occurs in the hydroxy derivative on the inner wall of the pipe and reproducibility of the process is reduced, so that it is difficult to stabilize the processing speed and processing accuracy of the metal film in mass production.

In addition, as is disclosed in the patent literatures, when the complexing gas gas-phase-premixed with the oxidizing gas is transported in the pipe, the oxidation of the iron-based metal element (transition metal element) on the inner wall surface of the pipe is accelerated. As a result, the reaction between the complexing gas and the pipe material is also promoted, so that the above-described problems are not solved but further deteriorate. Alternatively, when the mixed gas is transported in a pipe in which a reducing gas is mixed with the complexing gas in a gas phase, the iron-based metal element (transition metal element) on the inner wall surface of the pipe induces a catalytic decomposition of the complexing gas and the reducing gas, and thereby a risk of the carbon-based contamination increases.

In the present embodiment, the complexing gas raw material liquid is supplied in a liquid phase into the vacuum container 60 without being gasified in advance. Therefore, the pipe is not heated and a cooling state is maintained, so that decomposition of the complexing gas raw material liquid in the course of the liquid supplying can be minimized. Regarding the problem that the water vapor is adsorbed and occluded on the inner wall surface of the pipe when replacing the complexing gas raw material liquid tank, a small amount of a hydrophilic solvent may passes through the pipe to remove contaminants such as water molecules adsorbed and occluded on the inner wall surface of the pipe, in order to wash and remove contaminants such as water molecules adsorbed and occluded on the inner wall surface of the pipe prior to the liquid feeding operation of the complex gas raw material liquid. A substance that does not cause a chemical reaction with the complexing gas raw material liquid is selected as the hydrophilic solvent. Specific examples of the substance suitable as the hydrophilic solvent include linear ethers such as diethylene glycol dimethyl ether, propylene glycol dimethyl ether and triethylene glycol dimethyl ether, cyclic ethers such as tetrahydrofuran and trioxane, and cyclic esters such as γ-butyrolactone. Alternatively, a hydrophilic solvent having a vaporization characteristic similar to the main component thereof may be added to the complexing gas raw material liquid. Accordingly, with the hydrophilic solvent, it is possible to simultaneously achieve the processing of supplying the complexing gas raw material while solvation and washing and removing of various contaminants such as water molecules adsorbed and occluded on the inner wall surface of the pipe. In this case, the hydrophilic solvent may be stored in the raw material liquid tank in a mixed liquid phase where the hydrophilic solvent is previously added to the complexing gas raw material liquid. Alternatively, the hydrophilic solvent may be supplied as a mixed liquid, that is, the raw material liquid (main component) tank and a hydrophilic solvent tank may be separately provided and the raw material liquid and the hydrophilic solvent are mixed in a desired mixing ratio in the cource of the liquid supply. Here, specific examples of substance names of a part of the hydrophilic solvent having a vaporization characteristic similar to that of the main component used include linear ethers such as diethylene glycol dimethyl ether, propylene glycol dimethyl ether and triethylene glycol dimethyl ether, cyclic ethers such as tetrahydrofuran and trioxane, and cyclic esters such as γ-butyrolactone. The hydrophilic solvent may be appropriately from above in view of the vaporization characteristic of the main component of the complexing gas raw material liquid.

The complexing gas raw material liquid is supplied in a liquid phase until it passes through the raw material supply pipe 71 that is an injection port into the vacuum container 60, reaches the vaporizing nozzle unit 70 and is transformed into fine droplets therein, and is then rapidly vaporized. FIG. is a cross-sectional view showing a structure of the vaporizing nozzle unit 70 suitable for the present embodiment. The vaporizing nozzle unit 70 is configured as a stacked body of perforated heat exchanging plates 74, a plurality of perforated heat exchanging plates 74 are stacked with a slight gap therebetween, and adjacent perforated heat exchanging plates 74 are located at positions where holes thereof are deviated from each other when viewed from above. In a process of flowing the complexing gas raw material liquid as a liquid film in the gaps of the stacked perforated heat exchanging plates 74, a large turbulence flow is generated when a part of the flow falls into holes 75 of the heat exchanging plates 74, which results in cavitation and splits the part of the flow into fine droplets. Since a surface area of the gas-liquid interface is rapidly increased, an entire amount of the supplied complexing gas raw material liquid can be vaporized in a very short time. In the present embodiment, the complexing gas raw material liquid is heated only during vaporization, and the heat applied during the vaporization counteracts with heat of vaporization when the complexing gas raw material liquid is vaporized. Therefore, the reaction between inner wall surfaces of the vaporizing nozzle unit 70 and the complexing gas is minimized even if the iron-based metal element (transition metal element) is exposed on the inner wall surfaces of the vaporizing nozzle unit 70, and as a result, it is possible to avoid a decrease in etching rate and process reproducibility caused by blocking, contamination, and the like. Shapes of the holes 75 provided in the perforated heat exchanging plates 74, disposition of the holes in the surface, and the disposing number of the holes 75 may be determined in consideration of viscosity, flow rate, vapor pressure, boiling point, and the like of the complexing gas raw material liquid. FIG. 4A is an example of a perforated heat exchanging plate 74-1 in an uppermost layer of the vaporizing nozzle unit 70 shown in FIG. 3, and FIG. 4B is an example of another perforated heat exchanging plate 74-2 (note that the cross-sectional view in FIG. 3 is a cross-sectional view along a line A-A in FIG. 4A and a line B-B in FIG. 4B). In this way, the holes in the perforated heat exchanging plate 74-1 at the uppermost stage and the holes in the other perforated heat exchanging plates 74-2 are not aligned with each other. In the example, the holes 75 are arranged in one row in a concentric manner in the perforated heat exchanging plates 74-2, and the holes 75 may also be arranged in two or three rows. It is possible to stack the holes by disposing the holes in a deviated manner by stacking the perforated heat exchanging plates 74-2 in a configuration of being rotated in a circumferential direction.

An ejection angle 73 of the fine droplets from the vaporizing nozzle unit 70 can be regulated by the shape of the hole 75. The shape of the hole 75 is set so as to increase the ejection angle 73. FIG. 5 exemplifies the shape of the hole 75. As the shape of the hole 75, an opening diameter D, an opening tilt angle θ (oblique hole), and a chamfering value R of an entrance and exit can be adjusted. When the hole 75 is an oblique hole 75-2, the opening tilt angle θ is adjusted such that the flow of the fine droplets ejected from the vaporizing nozzle unit 70 forms an appropriate swirl vortex.

The vaporizing nozzle unit 70 shown in FIG. 1 is one example, and the vaporizing nozzle unit 70 may not have a magnitude equal to a cross section of the quartz chamber 12 as shown in FIG. 1. As described above, since the ejection angle can be controlled according to the shape of the hole provided in the perforated heat exchanging plate of the vaporizing nozzle unit, a vaporizing nozzle unit 70a in which the perforated heat exchanging plate is downsized as shown in FIG. 6 can be applied by setting the shape of the hole to spread the fine droplets over the entire vaporization chamber 2. By reducing the size, it is easy to maintain in-plane uniformity of the ejection amount, and the replacement work is facilitated when clogging is caused due to the contaminations in the holes.

Further, a vaporization nozzle unit does not necessarily have to be provided horizontally at an uppermost portion of the vaporization chamber 2. As illustrated in FIG. 7, when a vaporizing nozzle unit 70b is provided along an outer periphery of the upper inner wall of the vaporization chamber 2 provided in the upper portion of the quartz chamber 12, it is easy to generate a tumble vortex in addition to the swirl vortex generated inside the vaporization chamber 2, so that it is also applicable to a case of a low-volatility complexing gas raw material liquid. If necessary, an ejection direction of the fine droplets can be adjusted by changing the opening tilt angle of the hole of the perforated heat exchanging plate. Since the vaporizing nozzle unit 70b is disposed along the outer periphery of the upper inner wall of the vaporization chamber 2, the contact area between the inner wall of the vaporization chamber 2 and the vaporizing nozzle unit 70b is large. Therefore, the heat is smoothly supplied from the inner wall of the vaporization chamber 2 to the vaporizing nozzle unit 70b, and the in-plane uniformity of the ejection amount is improved. That is, in the vaporizing nozzle units 70 and 70a as exemplified in FIGS. 1 and 6, the heat for vaporizing the complexing gas raw material liquid is entirely supplied from the radiated wafer by the IR lamp 63 by using the reflected radiant heat, which is because the vaporizing nozzle unit 70b can exploit heat conduction from the quartz chamber 12 in addition to the radiant heat. If necessary, a heater for heating may be provided in the vaporizing nozzle unit.

The disposition of the vaporizing nozzle units illustrated in FIGS. 1, 6 and 7 may be combined, and the vaporizing nozzle units may be disposed at a center of the upper top plate and the outer periphery of the upper inner wall of the vaporization chamber 2. Even in the case of being provided on the outer periphery of the upper inner wall, it is not necessary to provide the vaporizing nozzle units on the entire inner wall, and the size may be reduced as shown in FIG. 6. However, it is desirable to provide a plurality of downsized vaporizing nozzle units on the outer periphery of the upper inner wall such that the complexing gas is uniformly discharged to the entire vaporization chamber 2.

In the semiconductor manufacturing apparatus 100 of FIG. 1, the plasma source is provided inside the vacuum container, but the oxidizing step and the complexing step described in FIG. 2 in may be performed in separate vacuum containers and only the complexing step is performed in this vacuum container. In this case, a mechanism related to the plasma source is unnecessary.

REFERENCE SIGN LIST 1 processing chamber
2 vaporization chamber
3 wafer
4 stage
5 discharge chamber
6 top plate
7 shower plate
40 control unit
60 vacuum container
62 heating lamp unit 63 IR lamp
64 reflection plate
65 IR light transmission window
67 slit plate
70, 70a, 70b vaporizing nozzle unit
71 raw material supply pipe
72 processing gas pipe
73 ejection angle
74 perforated heat exchanging plate
75 hole
76 filter unit
80 vacuum exhaust pipe

The invention claimed is:

1. A semiconductor manufacturing apparatus, comprising:
a vacuum container;
a processing chamber disposed in a lower portion of the vacuum container, and which includes a stage disposed in a central region of the lower portion of the processing chamber and on which a sample with a metal film containing a transition metal element is placed;
a vaporization chamber disposed in an upper portion of the vacuum container and which is configured to vaporize fine droplets of a complexing gas raw material liquid supplied from a vaporizing nozzle unit;
a path which communicates between the processing chamber and the vaporization chamber above the stage and through which the complexing gas obtained by vaporizing the complexing gas raw material liquid is introduced into the processing chamber and onto a surface of the metal film of the sample; and
a lamp heater unit disposed above the processing chamber and around the path, the lamp heater unit including at least one circular-shaped lamp heater and a transmission window disposed under the at least one of circular-shaped lamp heater through which electromagnetic waves are emitted downward from the at least one circular-shaped lamp heater toward the sample placed on the stage after the complexing gas is introduced onto the metal film of the sample to heat the sample to a predetermined temperature to etch the metal film.

2. The semiconductor manufacturing apparatus according to claim 1, wherein
a slit plate is provided between the vaporization chamber and the processing chamber to control a concentration distribution of the complexing gas in the processing chamber.

3. The semiconductor manufacturing apparatus according to claim 2, wherein
a quartz chamber is provided in the vacuum container, and the vaporization chamber is provided in an upper portion of the quartz chamber.

4. The semiconductor manufacturing apparatus according to claim 3, wherein
a discharge chamber is provided in the quartz chamber to generate plasma between the vaporization chamber and the processing chamber.

5. The semiconductor manufacturing apparatus according to claim 1, wherein
the vaporizing nozzle unit includes a plurality of stacked perforated heat exchanging plates, and
positions of holes provided in adjacent perforated heat exchanging plates are deviated as viewed from above.

6. The semiconductor manufacturing apparatus according to claim 3, wherein
the vaporizing nozzle unit is provided on a top plate or along an outer periphery of an upper inner wall of the quartz chamber.

7. The semiconductor manufacturing apparatus according to claim 1, wherein
the complexing gas raw material liquid is an organic compound capable of forming at least two or more coordination bonds with respect to an atom of the transition metal element.

* * * * *